United States Patent
Kishimoto et al.

(10) Patent No.: US 11,844,281 B2
(45) Date of Patent: Dec. 12, 2023

(54) PIEZOELECTRIC DEVICE

(71) Applicant: Murata Manufacturing Co., Ltd., Nagaokakyo (JP)

(72) Inventors: Yutaka Kishimoto, Nagaokakyo (JP); Shinsuke Ikeuchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 581 days.

(21) Appl. No.: 17/153,916

(22) Filed: Jan. 21, 2021

(65) Prior Publication Data
US 2021/0143315 A1 May 13, 2021

Related U.S. Application Data

(63) Continuation of application No. PCT/JP2019/017432, filed on Apr. 24, 2019.

(30) Foreign Application Priority Data
Sep. 21, 2018 (JP) ................... 2018-177134

(51) Int. Cl.
H01L 41/053 (2006.01)
H10N 30/30 (2023.01)
(Continued)

(52) U.S. Cl.
CPC ....... H10N 30/308 (2023.02); H10N 30/2047 (2023.02); H10N 30/85 (2023.02); H10N 30/87 (2023.02)

(58) Field of Classification Search
CPC .. H10N 30/308; H10N 30/2047; H10N 30/85; H10N 30/87
(Continued)

(56) References Cited

U.S. PATENT DOCUMENTS

| | | | |
|---|---|---|---|
| 11,005,025 B1 * | 5/2021 | Horsley | H10N 30/07 |
| 2001/0035700 A1 * | 11/2001 | Percin | B41J 2/1635 310/324 |

(Continued)

FOREIGN PATENT DOCUMENTS

| | | |
|---|---|---|
| JP | 2015-087284 A | 5/2015 |
| WO | 2007/114002 A1 | 10/2007 |

(Continued)

OTHER PUBLICATIONS

Official Communication issued in International Patent Application No. PCT/JP2019/017432, dated Jul. 16, 2019.

*Primary Examiner* — Derek J Rosenau
(74) *Attorney, Agent, or Firm* — Keating & Bennett, LLP

(57) ABSTRACT

A piezoelectric device includes a base portion and a membrane portion. The membrane portion is indirectly supported by the base portion, and is located on the upper side relative to the base portion. The membrane portion includes a plurality of layers. The membrane portion does not overlap with the base portion, and includes a single crystal piezoelectric layer, an upper electrode layer, and a lower electrode layer. The membrane portion is provided with a through-groove penetrating in the up-down direction. The through-groove includes a first step portion provided in the thickest layer among the plurality of layers defining the membrane portion. The width of the through-groove is narrower on a lower side than on an upper side with the first step portion as a boundary.

14 Claims, 10 Drawing Sheets

(51) Int. Cl.
    *H10N 30/85*      (2023.01)
    *H10N 30/87*      (2023.01)
    *H10N 30/20*      (2023.01)

(58) Field of Classification Search
    USPC .................................................. 310/324, 348
    See application file for complete search history.

(56)            References Cited

U.S. PATENT DOCUMENTS

2008/0007144 A1    1/2008  Takei et al.
    2017/0021391 A1    1/2017  Guedes et al.
    2017/0368574 A1   12/2017  Sammoura et al.
    2019/0193116 A1    6/2019  Horsley et al.

FOREIGN PATENT DOCUMENTS

WO      2016/054447 A1    4/2016
    WO      2016/115363 A1    7/2016
    WO      2017/218299 A1   12/2017

* cited by examiner

PIEZOELECTRIC DEVICE

CROSS REFERENCE TO RELATED APPLICATIONS

This application claims the benefit of priority to Japanese Patent Application No. 2018-177134 filed on Sep. 21, 2018 and is a Continuation Application of PCT Application No. PCT/JP2019/017432 filed on Apr. 24, 2019. The entire contents of each application are hereby incorporated herein by reference.

BACKGROUND OF THE INVENTION

1. Field of the Invention

The present invention relates to a piezoelectric device.

2. Description of the Related Art

As a document disclosing the configuration of a piezoelectric device, International Publication No. 2017/218299 can be provided. The piezoelectric device disclosed in International Publication No. 2017/218299 includes a substrate and a membrane portion. The substrate has an opening portion that penetrates therethrough. The membrane portion includes at least one elastic layer and at least one piezoelectric layer sandwiched between an upper electrode layer and a lower electrode layer. The membrane portion is attached to the substrate above the opening portion. In the membrane portion adjacent to or in a vicinity of an end of the opening portion, a through-groove is formed by etching.

In a piezoelectric device having a membrane portion including of a plurality of layers, delamination occurs in some cases due to stress generated in the membrane portion.

SUMMARY OF THE INVENTION

Preferred embodiments of the present invention provide piezoelectric devices that are each able to significantly reduce or prevent an occurrence of delamination caused by stress generated in a membrane portion.

A piezoelectric device according to a preferred embodiment of the present invention includes a base portion and a membrane portion. The membrane portion is indirectly supported by the base portion, and is located on an upper side relative to the base portion. The membrane portion includes a plurality of layers. The membrane portion does not overlap with the base portion, and includes a single crystal piezoelectric layer, an upper electrode layer, and a lower electrode layer. The upper electrode layer is provided on an upper side of the single crystal piezoelectric layer. The lower electrode layer faces at least a portion of the upper electrode layer with the single crystal piezoelectric layer interposed between the upper electrode layer and the lower electrode layer. The membrane portion is provided with a through-groove penetrating in an up-down direction. The through-groove includes a first step portion provided in the thickest layer among the plurality of layers defining the membrane portion. The width of the through-groove is narrower on a lower side than on an upper side with the first step portion as a boundary.

According to preferred embodiments of the present invention, in piezoelectric devices each including a membrane portion including a plurality of layers, an occurrence of delamination due to stress generated in the membrane portion is able to be significantly reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
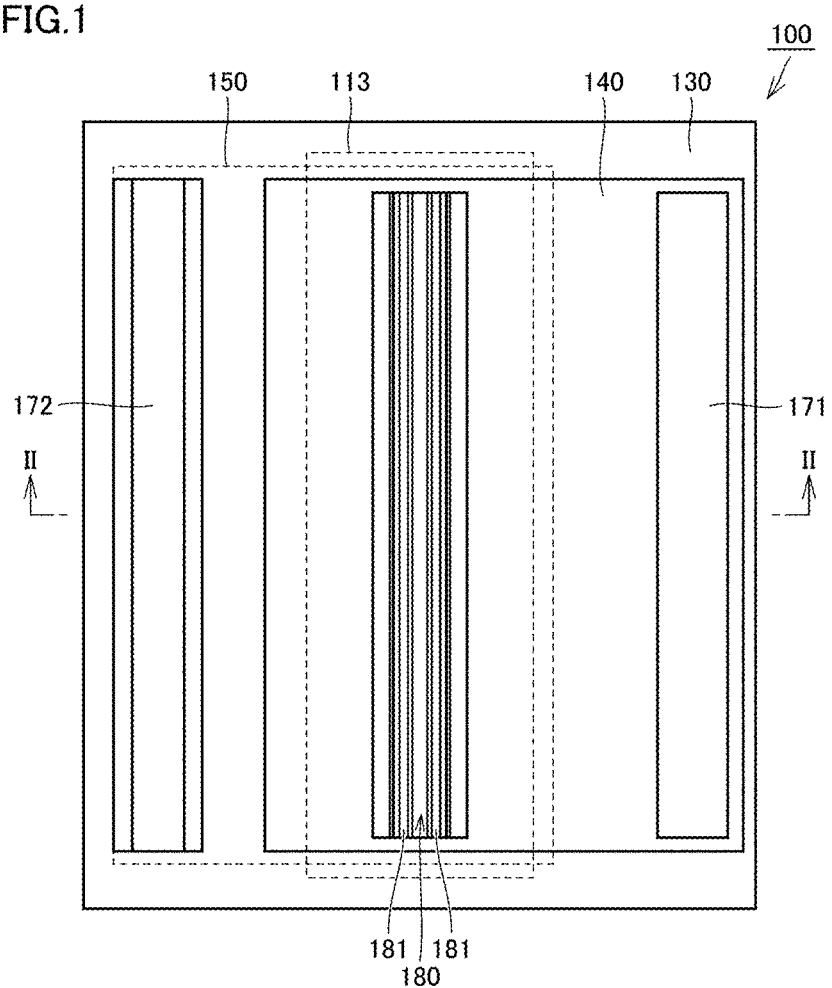
FIG. 1 is a plan view of a piezoelectric device according to a first preferred embodiment of the present invention.

Hereinafter, piezoelectric devices according to preferred embodiments of the present invention will be described with reference to the drawings. In the following description of the preferred embodiments, identical or corresponding elements in the drawings will be given the same reference numerals and description thereof will not be repeated.

First Preferred Embodiment

Figure 2:
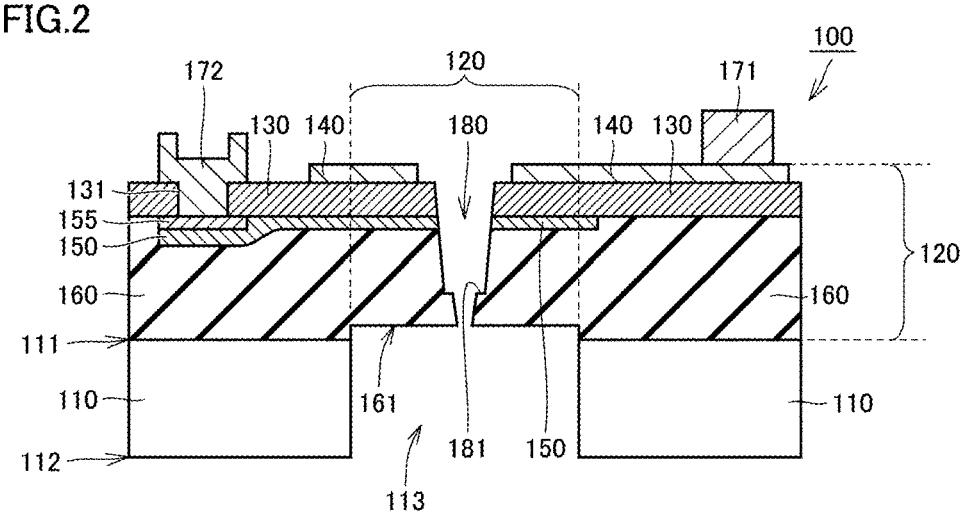
FIG. 2 is a cross-sectional view of the piezoelectric device in FIG. 1 when viewed from a direction of a line II-II.

FIG. 1 is a plan view of a piezoelectric device according to a first preferred embodiment of the present invention. FIG. 2 is a cross-sectional view of the piezoelectric device in FIG. 1 when viewed from a direction of a line II-II. In FIG. 1, the internal features of the piezoelectric device are indicated by a dotted line.

As shown in FIG. 1 and FIG. 2, a piezoelectric device 100 according to the first preferred embodiment of the present invention includes a base portion 110 and a membrane portion 120.

The base portion 110 includes an upper side main surface 111 and a lower side main surface 112 located on the opposite side from the upper side main surface 111. An opening portion 113 that penetrates in the up-down direction is provided in the base portion 110.

The forming material of the base portion is not particularly limited. In the first preferred embodiment, the base portion 110 is preferably made of Si, for example.

As shown in FIG. 2, a plurality of layers are laminated on the upper side main surface 111 of the base portion 110. The membrane portion 120 is a portion, of the plurality of layers, that is located on the upper side of the opening portion 113. That is, the membrane portion 120 includes a plurality of layers.

The membrane portion 120 is located on the upper side of the opening portion 113 of the base portion 110, and thus does not overlap with the base portion 110. That is, the membrane portion 120 is indirectly supported by the base portion 110, and is located on the upper side relative to the base portion 110.

As shown in FIG. 1 and FIG. 2, in the first preferred embodiment, the plurality of layers defining the membrane portion 120 include a single crystal piezoelectric layer 130, an upper electrode layer 140, a lower electrode layer 150, and an intermediate layer 160.

The single crystal piezoelectric layer 130 is located on the upper side relative to the base portion 110. A portion of the single crystal piezoelectric layer 130 is included in the membrane portion 120. Each of the upper surface and the lower surface of the single crystal piezoelectric layer 130 is flat.

The single crystal piezoelectric layer 130 includes a hole portion 131 which is different from a through-groove which will be described later. The hole portion 131 penetrates through the single crystal piezoelectric layer 130 in an up-down direction. In the first preferred embodiment, the hole portion 131 is located above the base portion 110, and is not included in the membrane portion 120.

The single crystal piezoelectric layer 130 is preferably made of, for example, lithium tantalate or lithium niobate. The single crystal piezoelectric layer 130 made of lithium tantalate or lithium niobate, for example, has a uniform polarization state.

The upper electrode layer 140 is provided on an upper side of the single crystal piezoelectric layer 130. A portion of the upper electrode layer 140 is included in the membrane portion 120.

In the first preferred embodiment, the upper electrode layer 140 is laminated on an upper side of a portion of the single crystal piezoelectric layer 130. Note that a close contact layer made of, for example, Ti or the like may be provided between the upper electrode layer 140 and the single crystal piezoelectric layer.

The lower electrode layer 150 faces at least a portion of the upper electrode layer 140 with the single crystal piezoelectric layer 130 interposed between the upper electrode layer 140 and the lower electrode layer 150. A portion of the lower electrode layer 150 is included in the membrane portion 120. Additionally, in the membrane portion 120, the lower electrode layer 150 faces at least a portion of the upper electrode layer 140 with the single crystal piezoelectric layer 130 interposed between the upper electrode layer 140 and the lower electrode layer 150.

A portion of the lower electrode layer 150 is located below the hole portion 131 provided in the single crystal piezoelectric layer 130. In the first preferred embodiment, the lower electrode layer 150 is connected to the single crystal piezoelectric layer 130 with a close contact layer 155 interposed between provided between the lower electrode layer 150 and the single crystal piezoelectric layer 130. The close contact layer 155 covers a lower portion of the hole portion 131 of the single crystal piezoelectric layer 130.

In the first preferred embodiment, a portion of the lower electrode layer 150 is provided on a lower side of the close contact layer 155 to cover the lower surface of the close contact layer 155. The close contact layer 155 is not included in the membrane portion 120. Note that the close contact layer 155 may be omitted. In the case where the close contact layer 155 is not provided, a portion of the lower electrode layer 150 directly covers the lower portion of the hole portion 131.

The lower electrode layer 150 is made of a conductive material, for example, Pt, Ni, Au, or the like. The material of the close contact layer 155 is not particularly limited as long as the material has conductivity and close contact property. The close contact layer 155 is preferably made of, for example, Ti, Cr, Ni, or NiCr.

The intermediate layer 160 is provided below the single crystal piezoelectric layer 130. In the first preferred embodiment, the intermediate layer 160 is in contact with the lower surface of the lower electrode layer 150 and a portion of the lower surface of the single crystal piezoelectric layer 130 that is not covered with the lower electrode layer 150.

A recessed portion 161 is provided on the lower surface of the intermediate layer 160, and a portion other than the recessed portion 161 is flat on the lower surface of the intermediate layer 160. As shown in FIG. 1 and FIG. 2, a lower side peripheral edge portion of the recessed portion 161 and an upper side peripheral edge portion of the opening portion 113 are continuous in the up-down direction. In the first preferred embodiment, an upper bottom surface of the recessed portion 161 defines a lower surface of the membrane portion 120.

Note that the intermediate layer 160 and the base portion 110 need not be directly connected to each other, and the intermediate layer 160 and the base portion 110 may be connected to each other with a metal layer interposed between the base portion 110 and the intermediate layer 160.

The material of the intermediate layer 160 is not particularly limited as long as it is an insulator. In the first preferred embodiment, the intermediate layer 160 is preferably made of, for example, $SiO_2$. Additionally, the intermediate layer 160 may made of an organic material having electric insulation property and heat insulation property.

The piezoelectric device 100 further includes a first outer electrode layer 171 and a second outer electrode layer 172. The first outer electrode layer 171 is laminated on the upper side of a portion of the upper electrode layer 140. The second outer electrode layer 172 is laminated on an upper side of a portion of the single crystal piezoelectric layer 130 and the close contact layer 155. That is, the second outer electrode layer 172 is, in the hole portion 131, laminated on the upper side of the lower electrode layer 150 with the close contact layer 155 interposed between the second outer electrode layer 172 and the lower electrode layer 150. Note that a two-layered wiring may be laminated as the lower electrode layer 150. Each of the first outer electrode layer 171 and the second outer electrode layer 172 is not included in the membrane portion 120.

As described above, the membrane portion 120 includes the single crystal piezoelectric layer 130, the upper electrode layer 140, the lower electrode layer 150, and the intermediate layer 160.

As shown in FIG. 2, in the membrane portion 120, the upper electrode layer 140 is provided on the upper side of the single crystal piezoelectric layer 130. In the membrane portion 120, the lower electrode layer 150 faces at least a portion of the upper electrode layer 140 with the single crystal piezoelectric layer 130 interposed between the upper electrode layer 140 and the lower electrode layer 150.

In the first preferred embodiment, the thickest layer among the plurality of layers defining the membrane portion 120 is the intermediate layer 160.

According to the features, components, and elements described above, by a voltage being applied between the upper electrode layer 140 and the lower electrode layer 150, the membrane portion 120 performs bending vibration up and down in accordance with expansion and contraction of the single crystal piezoelectric layer 130.

The membrane portion 120 is provided with a through-groove 180 penetrating therethrough in the up-down direction. As shown in FIG. 1 and FIG. 2, the width of the through-groove 180 at the upper electrode layer 140 is wider than the width of the through-groove 180 at the upper surface of the single crystal piezoelectric layer 130. A portion of the upper surface of the single crystal piezoelectric layer 130 adjacent to or in a vicinity of the through-groove 180 is exposed.

Note that the relationship between the groove widths of the through-groove 180 in the upper electrode layer 140 and the single crystal piezoelectric layer 130 is not limited to that described above. For example, the width of the through-groove 180 at the upper electrode layer 140 may be the same or substantially the same as the width of the through-groove 180 at the upper surface of the single crystal piezoelectric layer 130. An end surface of the upper electrode layer 140 and an end surface of the single crystal piezoelectric layer 130 each of which is located on the through-groove 180 side may be mutually continuous in the up-down direction.

In the first preferred embodiment, the end surface of the single crystal piezoelectric layer 130 and an end surface of the lower electrode layer 150 each of which is located on the through-groove 180 side are mutually continuous in the up-down direction.

In the first preferred embodiment, the end surface of the lower electrode layer 150 and an end surface of the intermediate layer 160 each of which is located on the through-groove 180 side are mutually continuous in the up-down direction. That is, among the plurality of layers defining the membrane portion 120, the end surface of the thickest layer and the end surfaces of the layers located on the thickest layer each of which is located on the through-groove 180 side are mutually continuous in the up-down direction.

In the first preferred embodiment, the through-groove 180 includes a first step portion 181 provided in the intermediate layer 160. That is, the through-groove 180 includes the first step portion 181 provided in the thickest layer among the plurality of layers defining the membrane portion 120. The width of the through-groove 180 is narrower on a lower side than on an upper side with the first step portion 181 as a boundary.

An end portion of the through-groove 180 on the opening portion 113 side is located on the upper bottom surface of the recessed portion 161 of the intermediate layer 160.

As shown in FIG. 2, the width of the through-groove 180 decreases as progressing from an upper end toward a lower end of the through-groove 180. Note that the width of the through-groove 180 may decrease stepwise as progressing from the upper end toward the lower end of the through-groove 180. That is, a portion in which the through-groove 180 has a uniform width may be included as progressing from the upper end toward the lower end of the through-groove 180. In the first preferred embodiment, the width of the through-groove 180 is substantially uniform from the upper end to the lower end of the upper electrode layer. As described above, the through-groove 180 has the narrowest width at the end portion on the opening portion 113 side.

Hereinafter, a manufacturing method for the piezoelectric device according to the first preferred embodiment of the present invention will be described.

Figure 3:
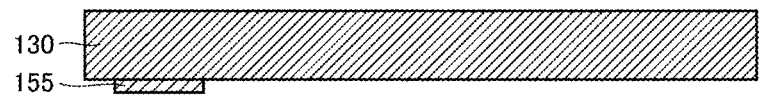
FIG. 3 is a cross-sectional view showing a state in which a close contact layer is provided on the lower surface of a single crystal piezoelectric layer in a manufacturing method for the piezoelectric device according to the first preferred embodiment of the present invention.

FIG. 3 is a cross-sectional view showing a state in which the close contact layer is provided on the lower surface of the single crystal piezoelectric layer in an example of a manufacturing method for the piezoelectric device according to the first preferred embodiment of the present invention. The thickness of the single crystal piezoelectric layer 130 at the time of formation is larger than the thickness of the single crystal piezoelectric layer 130 finally included in the piezoelectric device 100 according to the first preferred embodiment.

As shown in FIG. 3, the close contact layer 155 is provided on the lower surface of the single crystal piezoelectric layer 130 by a lift-off method, a plating method, an etching method, or the like, for example.

Figure 4:
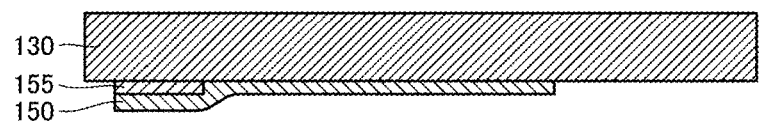
FIG. 4 is a cross-sectional view showing a state in which a lower electrode layer is provided on the respective lower surfaces of the close contact layer and the single crystal piezoelectric layer in an example of a manufacturing method for the piezoelectric device according to the first preferred embodiment of the present invention.

FIG. 4 is a cross-sectional view showing a state in which the lower electrode layer is provided on the respective lower surfaces of the close contact layer and the single crystal piezoelectric layer in the manufacturing method for the piezoelectric device according to the first preferred embodiment of the present invention. As shown in FIG. 4, the lower electrode layer 150 is provided on the entire lower surface of the close contact layer 155 and a portion of the lower surface of the single crystal piezoelectric layer by the lift-off method, the plating method, the etching method, or the like, for example.

Figure 5:
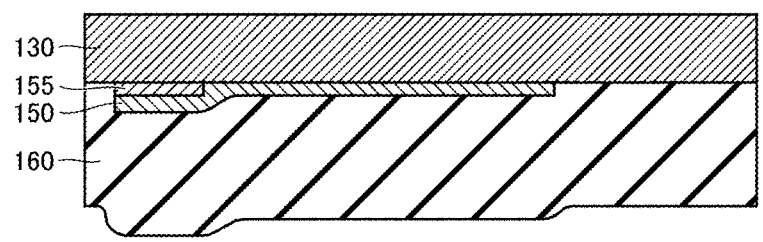
FIG. 5 is a cross-sectional view showing a state in which an intermediate layer is provided on the respective lower surfaces of the lower electrode layer and the single crystal piezoelectric layer in an example of a manufacturing method for the piezoelectric device according to the first preferred embodiment of the present invention.

FIG. 5 is a cross-sectional view showing a state in which the intermediate layer is provided on the respective lower surfaces of the lower electrode layer and the single crystal piezoelectric layer in the example of the manufacturing method for the piezoelectric device according to the first preferred embodiment of the present invention. As shown in FIG. 5, the intermediate layer 160 is provided on the respective lower surfaces of the lower electrode layer 150 and the single crystal piezoelectric layer 130 by a CVD (Chemical Vapor Deposition) method, a PVD (Physical Vapor Deposition) method, or the like, for example.

Figure 6:
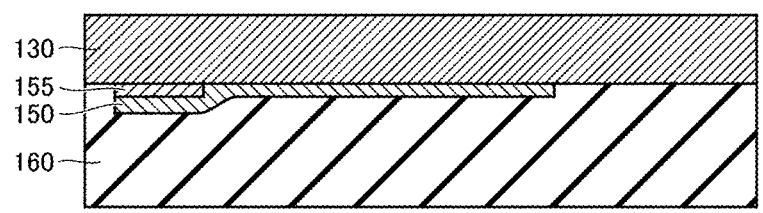
FIG. 6 is a cross-sectional view showing a state in which the lower surface of the intermediate layer is flattened in an example of a manufacturing method for the piezoelectric device according to the first preferred embodiment of the present invention.

FIG. 6 is a cross-sectional view showing a state in which the lower surface of the intermediate layer is flattened in the example of the manufacturing method for the piezoelectric device according to the first preferred embodiment of the present invention. As shown in FIG. 6, the lower surface of the intermediate layer 160 is flattened by Chemical Mechanical Polishing (CMP) or the like, for example.

Figure 7:
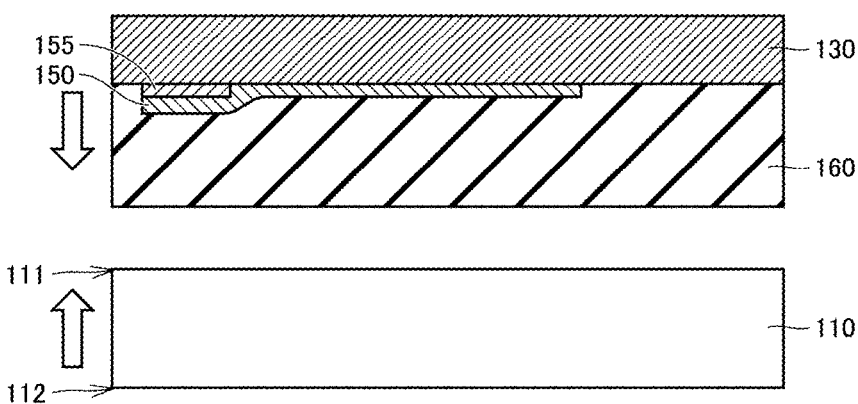
FIG. 7 is a cross-sectional view showing a state in which a base portion is to be bonded to a plurality of layers shown in FIG. 6 in an example of a manufacturing method for the piezoelectric device according to the first preferred embodiment of the present invention.
Figure 8:
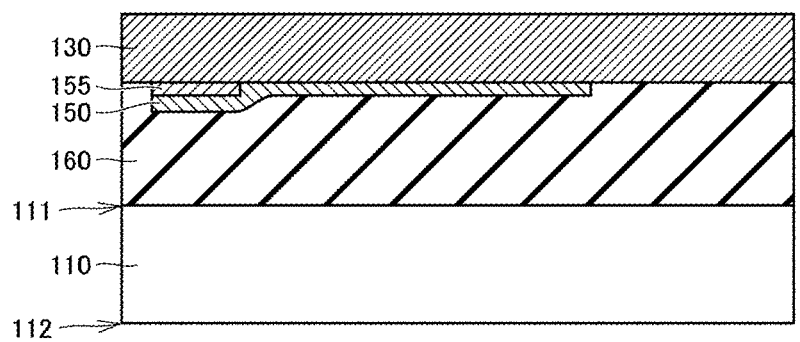
FIG. 8 is a cross-sectional view showing a state in which the base portion is bonded to the lower surface of the intermediate layer in an example of a manufacturing method for the piezoelectric device according to the first preferred embodiment of the present invention.

FIG. 7 is a cross-sectional view showing a state in which the base portion is to be bonded to the plurality of layers shown in FIG. 6 in the example of the manufacturing method for the piezoelectric device according to the first preferred embodiment of the present invention. FIG. 8 is a cross-sectional view showing a state in which the base portion is bonded to the lower surface of the intermediate layer in the example of the manufacturing method for the piezoelectric device according to the first preferred embodiment of the present invention.

As shown in FIG. 7 and FIG. 8, the substrate, which is the base portion 110 in which the opening portion 113 is not formed, is bonded to the lower surface of the intermediate layer 160.

Figure 9:
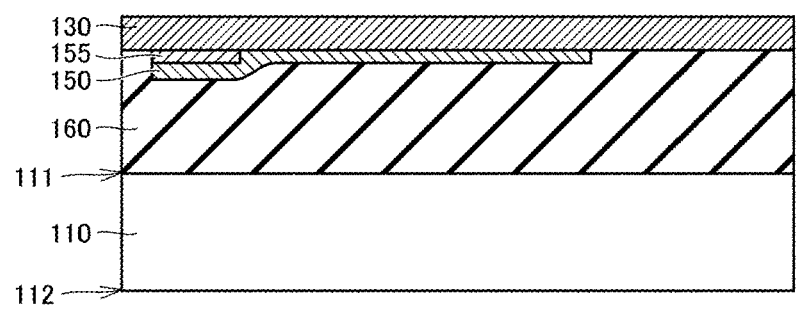
FIG. 9 is a cross-sectional view showing a state in which the upper surface of the single crystal piezoelectric layer is scraped in an example of a manufacturing method for the piezoelectric device according to the first preferred embodiment of the present invention.

FIG. 9 is a cross-sectional view showing a state in which the upper surface of the single crystal piezoelectric layer is scraped in the example of the manufacturing method for the piezoelectric device according to the first preferred embodiment of the present invention. As shown in FIG. 9, the upper surface of the single crystal piezoelectric layer 130 is scraped by CMP or the like example of the to provide the single crystal piezoelectric layer 130 with a predetermined thickness. Accordingly, the thickness of the single crystal piezoelectric layer 130 is adjusted to provide a predetermined expansion/contraction amount of the single crystal piezoelectric layer 130 by applying a voltage.

Note that a release layer may be formed by ion implantation in advance on the upper surface side of the single crystal piezoelectric layer 130. Accordingly, by peeling off the release layer before the upper surface of the single crystal piezoelectric layer 130 is scraped by CMP or the like, for example, the thickness of the single crystal piezoelectric layer 130 is easily adjusted.

Figure 10:
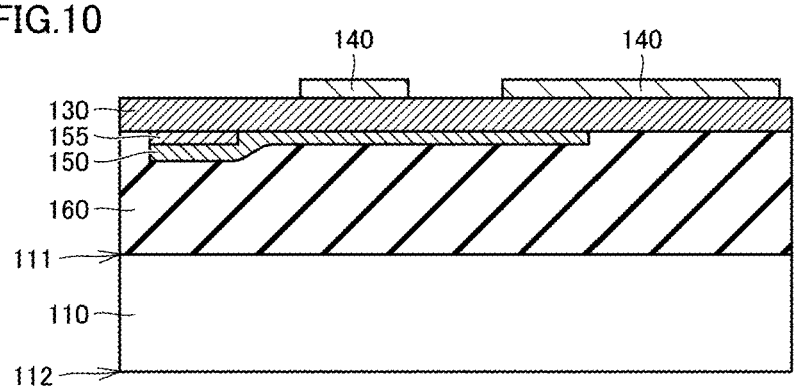
FIG. 10 is a cross-sectional view showing a state in which an upper electrode layer is provided on the upper surface of the single crystal piezoelectric layer in an example of a manufacturing method for the piezoelectric device according to the first preferred embodiment of the present invention.

FIG. 10 is a cross-sectional view showing a state in which the upper electrode layer is provided on the upper surface of the single crystal piezoelectric layer in the example of the manufacturing method for the piezoelectric device according to the first preferred embodiment of the present invention. As shown in FIG. 10, the upper electrode layer 140 is provided on a portion of the upper surface of the single crystal piezoelectric layer 130 by the lift-off method, the plating method, the etching method, or the like, for example.

Figure 11:
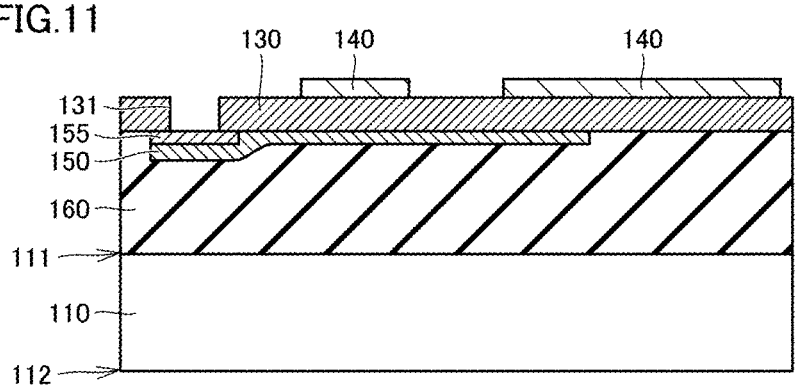
FIG. 11 is a cross-sectional view showing a state in which a hole portion is provided in the single crystal piezoelectric layer in an example of a manufacturing method for the piezoelectric device according to the first preferred embodiment of the present invention.

FIG. 11 is a cross-sectional view showing a state in which the hole portion is provided in the single crystal piezoelectric layer in the example of the manufacturing method for the piezoelectric device according to the first preferred embodiment of the present invention. As shown in FIG. 11, by etching a portion of the single crystal piezoelectric layer 130, the hole portion 131 is formed.

Figure 12:
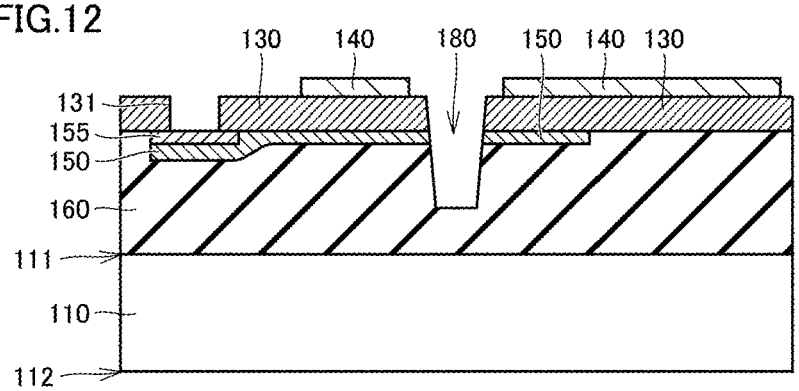
FIG. 12 is a cross-sectional view showing a state in which a through-groove is provided from the single crystal piezoelectric layer to the middle of the intermediate layer in an example of a manufacturing method for the piezoelectric device according to the first preferred embodiment of the present invention.

FIG. 12 is a cross-sectional view showing a state in which the through-groove is provided from the single crystal piezoelectric layer to the middle of the intermediate layer in the example of the manufacturing method for the piezoelectric device according to the first preferred embodiment of the present invention. As shown in FIG. 12, by etching from the single crystal piezoelectric layer 130 side, the through-groove 180 is formed from the single crystal piezoelectric layer 130 to the middle of the intermediate layer 160. With this, a trench is formed in the intermediate layer 160.

Figure 13:
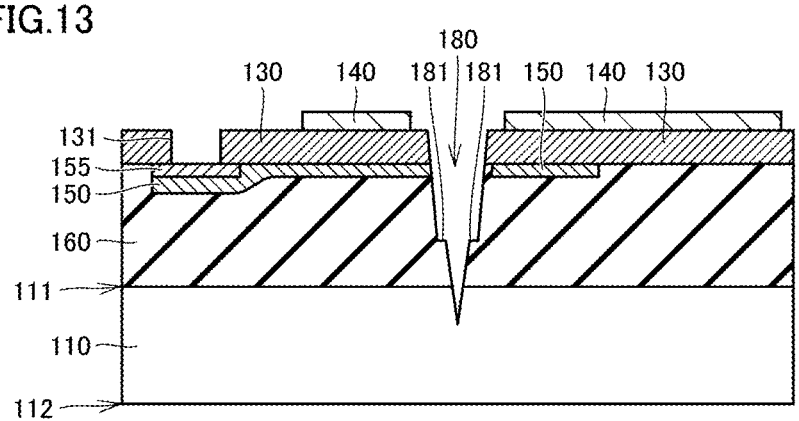
FIG. 13 is a cross-sectional view showing a state in which the through-groove reaches the lower surface of the intermediate layer in an example of a manufacturing method for the piezoelectric device according to the first preferred embodiment of the present invention.

FIG. 13 is a cross-sectional view showing a state in which the through-groove reaches the lower surface of the intermediate layer in the example of the manufacturing method for the piezoelectric device according to the first preferred embodiment of the present invention. As shown in FIG. 13, by further etching the bottom portion of the trench formed in the intermediate layer 160, the through-groove 180 reaches the lower surface of the intermediate layer 160. In the through-groove 180, the first step portion 181 is formed in the intermediate layer 160. With this etching, in the base portion 110, a trench as shown in FIG. 13 may be formed, or a trench may not be formed.

Figure 14:
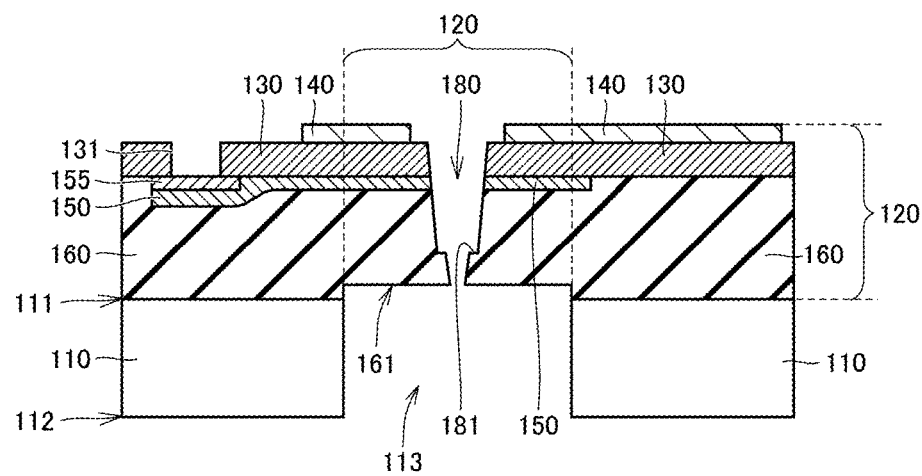
FIG. 14 is a cross-sectional view showing a state in which an opening portion is formed in an example of a manufacturing method for the piezoelectric device according to the first preferred embodiment of the present invention.

FIG. 14 is a cross-sectional view showing a state in which the opening portion is formed in the example of the manufacturing method for the piezoelectric device according to the first preferred embodiment of the present invention. As shown in FIG. 14, the opening portion 113 is formed in the base portion 110 by performing Deep Reactive Ion Etching (Deep RIE) or the like on the base portion 110 from the lower side main surface 112 side of the base portion 110, and the recessed portion 161 is formed in the intermediate layer 160. As a result, in the piezoelectric device 100 according to the first preferred embodiment, the membrane portion 120 is formed.

Finally, the first outer electrode layer 171 and the second outer electrode layer 172 are each provided by the lift-off method, the plating method, the etching method, or the like, for example. Note that each of the first outer electrode layer 171 and the second outer electrode layer 172 may be provided before forming the membrane portion 120. Through the above-described steps, the piezoelectric device 100 according to the first preferred embodiment of the present invention as shown in FIG. 2 is manufactured.

As described above, in the piezoelectric device 100 according to the first preferred embodiment of the present invention, the through-groove 180 includes the first step portion 181 provided in the thickest layer among the plurality of layers defining the membrane portion 120, and the width of the through-groove 180 is narrower on the lower side than on the upper side with the first step portion 181 as a boundary.

As a result, stress concentration on a portion between the intermediate layer 160, which is the thickest layer, and the lower electrode layer 150 adjacent to or in a vicinity of the intermediate layer 160, on which the highest stress acts when the membrane portion 120 performs bending vibration, is able to be significantly reduced or prevented by the first step portion 181, and thus an occurrence of delamination between the intermediate layer 160 and the lower electrode layer 150 due to the stress generated in the membrane portion 120 is able to be significantly reduced or prevented.

In particular, in the first preferred embodiment, since the end surface of the lower electrode layer 150 and the end surface of the intermediate layer 160 each of which is located on the through-groove 180 side are mutually continuous in the up-down direction, the stress concentration between the intermediate layer 160 and the lower electrode layer 150 is able to be significantly reduced or prevented by the first step portion 181.

In the piezoelectric device 100 according to the first preferred embodiment, the width of the through-groove 180 decreases as progressing from the upper end toward the lower end of the through-groove 180. With this, the width of the through-groove 180 on the lower side relative to the first step portion 181 is able to be significantly reduced while ensuring the wide width of the through-groove 180 in the portion where the single crystal piezoelectric layer 130 is located.

Accordingly, the stress acting on the single crystal piezoelectric layer 130 is able to be significantly reduced or prevented when the membrane portion 120 performs bending vibration, and to significantly reduce or prevent the occurrence of delamination at each of the portion between the single crystal piezoelectric layer 130 and the upper electrode layer 140 and the portion between the single crystal piezoelectric layer 130 and the lower electrode layer 150. Furthermore, since the width of the through-groove 180 on the lower side relative to the first step portion 181 is able to be significantly reduced, an occurrence of deterioration in characteristics of the piezoelectric device 100 due to an excessive increase in the width of the through-groove 180 is able to be significantly reduced or prevented. For example, in a case where the piezoelectric device 100 is used as an acoustic device, a decrease in acoustic resistance due to the excessive increase in the width of the through-groove 180 is able to be significantly reduced or prevented.

In the piezoelectric device 100 according to the first preferred embodiment, the single crystal piezoelectric layer 130 is preferably made of lithium tantalate or lithium niobate. Accordingly, the piezoelectricity of the piezoelectric device 100 is able to be significantly improved.

Note that in the piezoelectric device 100 according to the first preferred embodiment, a plurality of step portions may be provided in the through-groove 180. Here, modifications of the piezoelectric device 100 according to the first preferred embodiment will be described.

Figure 15:
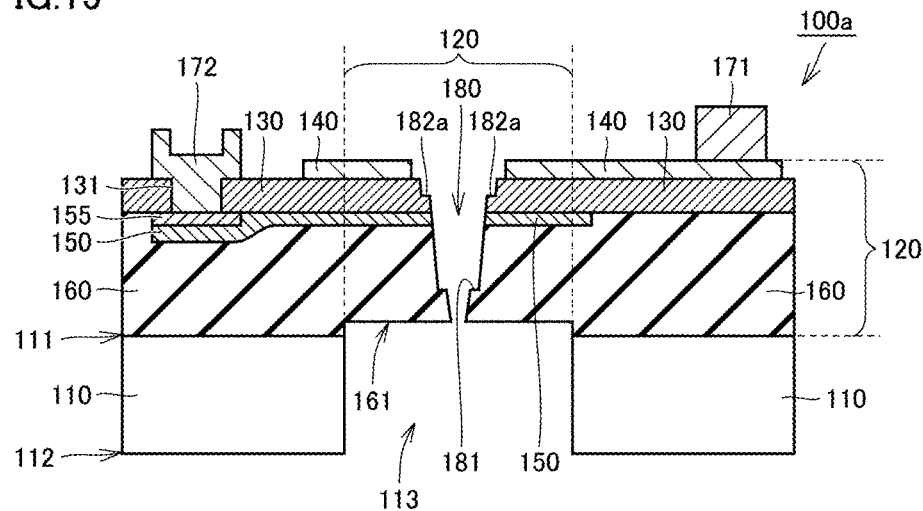
FIG. 15 is a cross-sectional view of a piezoelectric device according to a first modification of the first preferred embodiment of the present invention.

FIG. 15 is a cross-sectional view of a piezoelectric device according to a first modification of the first preferred embodiment of the present invention. The cross-sectional view of a piezoelectric device 100a shown in FIG. 15 shows a cross section viewed similar to the cross-sectional view of the piezoelectric device 100 shown in FIG. 2.

As shown in FIG. 15, in the piezoelectric device 100a according to the first modification of the first preferred embodiment of the present invention, the through-groove 180 further includes a second step portion 182a provided in the single crystal piezoelectric layer 130.

In the present modification, the second step portion 182a may be formed by, for example, performing etching to provide the through-groove 180 in the single crystal piezoelectric layer 130 in two divided steps. First, a trench is formed in the single crystal piezoelectric layer 130 by first etching. The bottom portion of the trench of the single crystal piezoelectric layer 130 is etched by second etching. As a result, the second step portion 182a is able to be formed in the single crystal piezoelectric layer 130.

Figure 16:
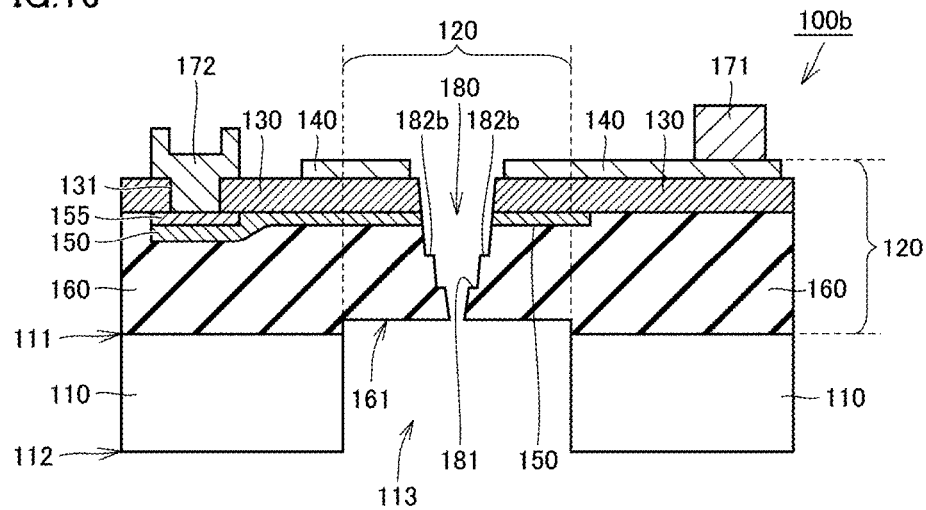
FIG. 16 is a cross-sectional view of a piezoelectric device according to a second modification of the first preferred embodiment of the present invention.

FIG. 16 is a cross-sectional view of a piezoelectric device according to a second modification of the first preferred embodiment of the present invention. The cross-sectional view of a piezoelectric device 100b shown in FIG. 16 shows a cross section viewed similar to the cross-sectional view of the piezoelectric device 100 shown in FIG. 2.

As shown in FIG. 16, in the piezoelectric device 100b according to the second modification of the first preferred embodiment of the present invention, the through-groove 180 further includes a second step portion 182b provided in the intermediate layer 160 which is the thickest layer among the plurality of layers defining the membrane portion 120.

In the present modification, the second step portion 182b may be formed by, for example, performing etching to provide the through-groove 180 in the intermediate layer 160 in three divided steps. First, a first trench is formed in the intermediate layer 160 by first etching. A second trench is formed by etching the bottom portion of the first trench by second etching. With this, the second step portion 182b is able to be formed in the intermediate layer 160. The bottom portion of the second trench is etched by third etching. As a result, the first step portion 181 is able to be formed in the intermediate layer 160.

As described above, in the piezoelectric devices 100a and 100b respectively according to the first modification and the second modification of the first preferred embodiment of the present invention, the through-groove 180 further includes the second step portion 182a or 182b provided in any one layer among the plurality of layers defining the membrane portion 120, above the first step portion 181. The width of the through-groove 180 is narrower on the lower side than on the upper side with each of the second step portions 182a and 182b as a boundary.

As a result, stress concentration between layers of the plurality of layers defining the membrane portion 120 when the membrane portion 120 performs bending vibration is able to be significantly reduced or prevented also by the second step portions 182a and 182b, and thus an occurrence of delamination due to the stress generated in the membrane portion 120 is able to be further significantly reduced or prevented.

Second Preferred Embodiment

Hereinafter, a piezoelectric device according to a second preferred embodiment of the present invention will be described. The piezoelectric device according to the second preferred embodiment of the present invention differs from the piezoelectric device 100 according to the first preferred embodiment mainly in the features of each of the membrane portion and the base portion. Accordingly, description of the same or similar features as the piezoelectric device 100 according to the first preferred embodiment of the present invention will not be repeated.

Figure 17:
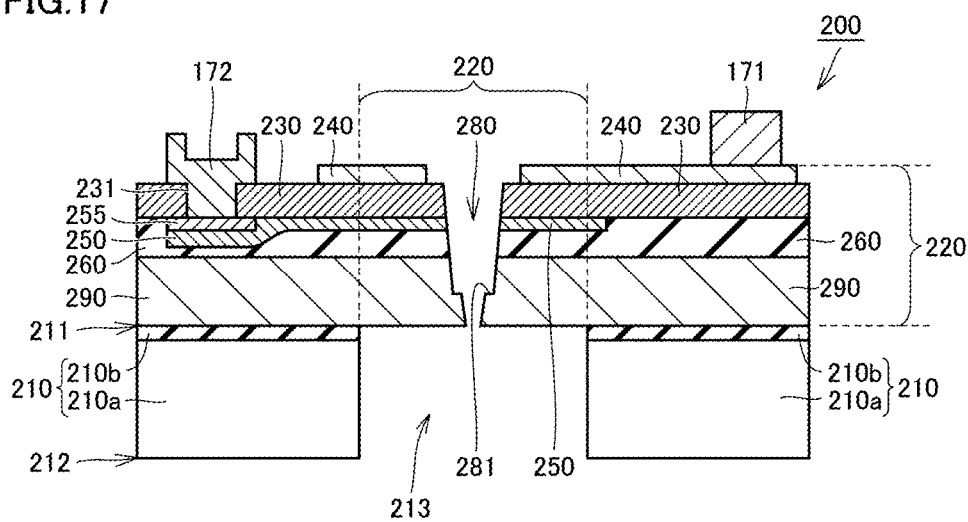
FIG. 17 is a cross-sectional view of a piezoelectric device according to a second preferred embodiment of the present invention.

FIG. 17 is a cross-sectional view of the piezoelectric device according to the second preferred embodiment of the present invention. The cross-sectional view of a piezoelectric device 200 shown in FIG. 17 shows a cross section viewed similar to the cross-sectional view of the piezoelectric device 100 shown in FIG. 2.

As shown in FIG. 17, the piezoelectric device 200 according to the second preferred embodiment of the present invention includes a base portion 210 and a membrane portion 220.

As shown in FIG. 17, the base portion 210 includes a lower side base portion 210a and an upper side base portion 210b located on an upper side of the lower side base portion 210a. The base portion 210 has an upper side main surface 211 and a lower side main surface 212 located on the opposite side from the upper side main surface 211. In the second preferred embodiment, the upper surface of the upper side base portion 210b is the upper side main surface 211, and the lower surface of the lower side base portion 210a is the lower side main surface 212. An opening portion 213 that penetrates through the lower side base portion 210a and the upper side base portion 210b in the up-down direction is provided in the base portion 210.

The forming material of the base portion 210 is not particularly limited. In the second preferred embodiment, the lower side base portion 210a is preferably made of, for example, Si. The upper side base portion 210b is preferably made of, for example, $SiO_2$.

As shown in FIG. 17, a plurality of layers are laminated on the upper side main surface 211 of the base portion 210. The membrane portion 220 is a portion, of the plurality of layers, that is located on the upper side of the opening portion 213. That is, the membrane portion 220 includes a plurality of layers.

The membrane portion 220 is located on the upper side of the opening portion 213 of the base portion 210, and thus does not overlap with the base portion 210. That is, the membrane portion 220 is indirectly supported by the base portion 210, and is located on the upper side relative to the base portion 210.

As shown in FIG. 17, in the second preferred embodiment, the plurality of layers defining the membrane portion 220 include a single crystal piezoelectric layer 230, an upper electrode layer 240, a lower electrode layer 250, an intermediate layer 260, and an active layer 290.

In the second preferred embodiment, no recessed portion is provided on the lower surface of the intermediate layer 260. In addition, the intermediate layer 260 in the second preferred embodiment has a thickness smaller than that of the intermediate layer 160 in the first preferred embodiment of the present invention.

The active layer 290 is connected to the entire or substantially the entire lower surface of the intermediate layer 260. Furthermore, the active layer 290 is laminated on the upper side main surface 211 of the base portion 210 to cover the upper portion of the opening portion 213. That is, in the second preferred embodiment, the lower surface of the intermediate layer 260 is exposed to the opening portion 213.

The forming material of the active layer 290 is not particularly limited, but in the second preferred embodiment, the active layer 290 is preferably made of, for example, Si.

As described above, in the second preferred embodiment, the membrane portion 220 includes the single crystal piezoelectric layer 230, the upper electrode layer 240, the lower electrode layer 250, the intermediate layer 260, and the active layer 290.

As shown in FIG. 17, in the membrane portion 220, the upper electrode layer 240 is provided on the upper side of the single crystal piezoelectric layer 230. In the membrane portion 220, the lower electrode layer 250 faces at least a portion of the upper electrode layer 240 with the single crystal piezoelectric layer 230 interposed between the upper electrode layer 240 and the lower electrode layer 250.

In the second preferred embodiment, the thickest layer among the plurality of layers defining the membrane portion 220 is the active layer 290.

According to the features, components, and elements described above, by a voltage being applied between the upper electrode layer 240 and the lower electrode layer 250, the membrane portion 220 performs bending vibration up and down in accordance with expansion and contraction of the single crystal piezoelectric layer 230.

The membrane portion 220 is provided with a through-groove 280 penetrating therethrough in the up-down direction.

In the second preferred embodiment, the end surface of the intermediate layer 260 and an end surface of the active layer 290 each of which is located on the through-groove 280 side are mutually continuous in the up-down direction. That is, among the plurality of layers defining the membrane portion 220, the end surface of the thickest layer and the end surfaces of the layers located on the thickest layer each of which is located on the through-groove 280 side are mutually continuous in the up-down direction.

In the second preferred embodiment, the through-groove 280 includes a first step portion 281 provided in the active layer 290. That is, the through-groove 280 includes the first step portion 281 in the thickest layer among the plurality of layers defining the membrane portion 220. The width of the through-groove 280 is narrower on a lower side than on an upper side with the first step portion 281 as a boundary.

An end portion of the through-groove 280 on the opening portion 213 side is located on the lower surface of the intermediate layer 260.

As shown in FIG. 17, the width of the through-groove 280 decreases as progressing from an upper end toward a lower end of the through-groove 280. Note that the width of the through-groove 280 may decrease stepwise as progressing from the upper end toward the lower end of the through-groove 280. That is, a portion in which the through-groove 280 has a uniform width may be included as progressing from the upper end toward the lower end of the through-groove 280. In the second preferred embodiment, the width of the through-groove 280 is substantially uniform from the upper end to the lower end of the upper electrode layer. As described above, the through-groove 280 has the narrowest width at the end portion on the opening portion 213 side.

Hereinafter, an example of a manufacturing method for the piezoelectric device according to the second preferred embodiment of the present invention will be described.

Figure 18:
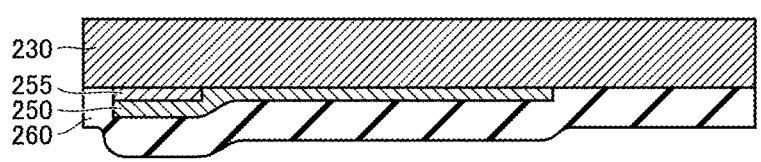
FIG. 18 is a cross-sectional view showing a state in which an intermediate layer is provided on the respective lower surfaces of the lower electrode layer and the single crystal piezoelectric layer in an example of a manufacturing method for the piezoelectric device according to the second preferred embodiment of the present invention.

FIG. 18 is a cross-sectional view showing a state in which the intermediate layer is provided on the respective lower surfaces of the lower electrode layer and the single crystal piezoelectric layer in the example of the manufacturing method for the piezoelectric device according to the second preferred embodiment of the present invention. First, similar to the example of the manufacturing method for the piezoelectric device 100 according to the first preferred embodiment of the present invention, a close contact layer 255 and the lower electrode layer 250 are provided on the lower side of the single crystal piezoelectric layer 230. Next, as shown in FIG. 18, the intermediate layer 260 is provided on the respective lower surfaces of the lower electrode layer 250 and the single crystal piezoelectric layer 230 by the CVD method, the PVD method, or the like.

Figure 19:
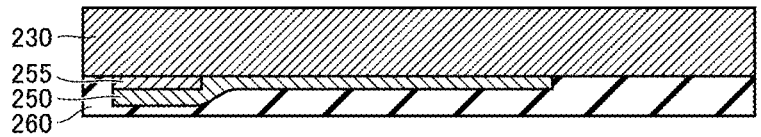
FIG. 19 is a cross-sectional view showing a state in which the lower surface of the intermediate layer is flattened in an example of a manufacturing method for the piezoelectric device according to the second preferred embodiment of the present invention.

FIG. 19 is a cross-sectional view showing a state in which the lower surface of the intermediate layer is flattened in the example of the manufacturing method for the piezoelectric device according to the second preferred embodiment of the present invention. As shown in FIG. 19, the lower surface of the intermediate layer 260 is flattened by chemical mechanical polishing or the like.

Figure 20:
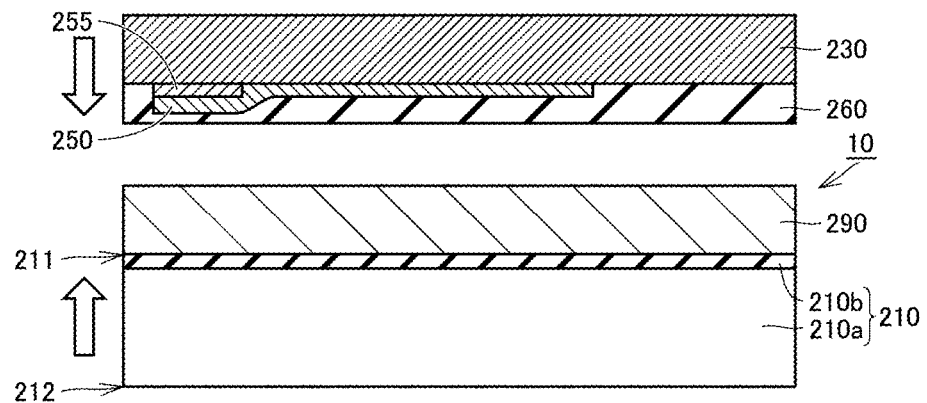
FIG. 20 is a cross-sectional view showing a state in which a multilayer body is to be bonded to a plurality of layers shown in FIG. 19 in an example of a manufacturing method for the piezoelectric device according to the second preferred embodiment of the present invention.
Figure 21:
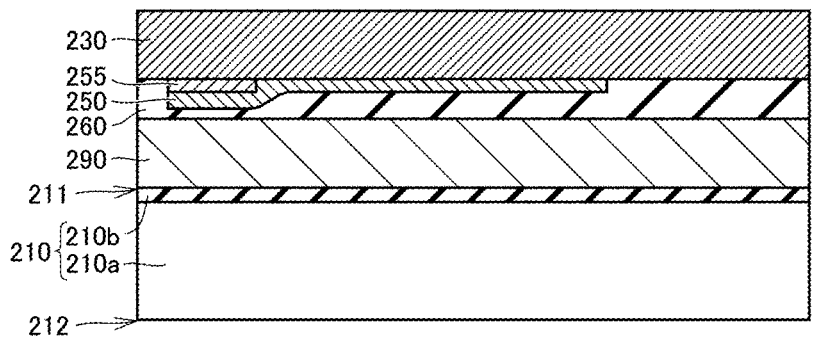
FIG. 21 is a cross-sectional view showing a state in which the multilayer body is bonded to the lower surface of the intermediate layer in an example of a manufacturing method for the piezoelectric device according to the second preferred embodiment of the present invention.

FIG. 20 is a cross-sectional view showing a state in which a multilayer body is to be bonded to a plurality of layers shown in FIG. 19 in the example of the manufacturing method for the piezoelectric device according to the second preferred embodiment of the present invention. FIG. 21 is a cross-sectional view showing a state in which the multilayer body is bonded to the lower surface of the intermediate layer in the example of the manufacturing method for the piezoelectric device according to the second preferred embodiment of the present invention.

As shown in FIG. 20 and FIG. 21, a multilayer body 10 is bonded to the lower surface of the intermediate layer 260. The multilayer body 10 includes the base portion 210 in which the opening portion 213 is not formed, and the active layer 290 bonded to the upper surface of the base portion 210. In the second preferred embodiment, the multilayer body 10 is preferably, for example, an SOI (Silicon on Insulator) substrate.

Figure 22:
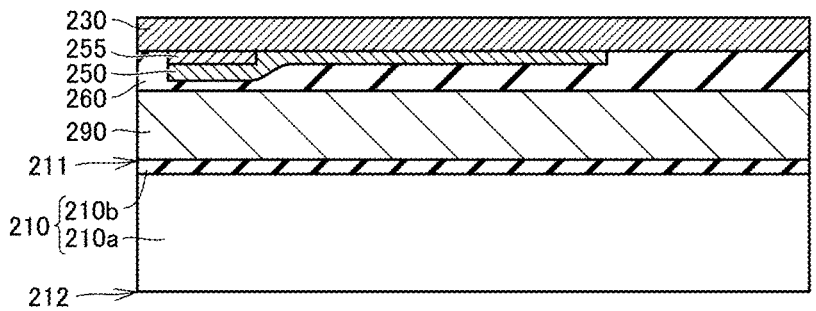
FIG. 22 is a cross-sectional view showing a state in which the upper surface of the single crystal piezoelectric layer is scraped in an example of a manufacturing method for the piezoelectric device according to the second preferred embodiment of the present invention.

FIG. 22 is a cross-sectional view showing a state in which the upper surface of the single crystal piezoelectric layer is scraped in the example of the manufacturing method for the piezoelectric device according to the second preferred embodiment of the present invention. As shown in FIG. 22, the upper surface of the single crystal piezoelectric layer 230 is scraped by CMP or the like, for example, to provide the single crystal piezoelectric layer 230 with a predetermined thickness. Accordingly, the thickness of the single crystal piezoelectric layer 230 is adjusted to provide a desired expansion/contraction amount of the single crystal piezoelectric layer 230 by applying a voltage.

Note that a release layer may be formed by ion implantation in advance on the upper surface side of the single crystal piezoelectric layer 230. Accordingly, by peeling off the release layer before the upper surface of the single crystal piezoelectric layer 230 is scraped by CMP or the like, the thickness of the single crystal piezoelectric layer 230 is easily adjusted.

Figure 23:
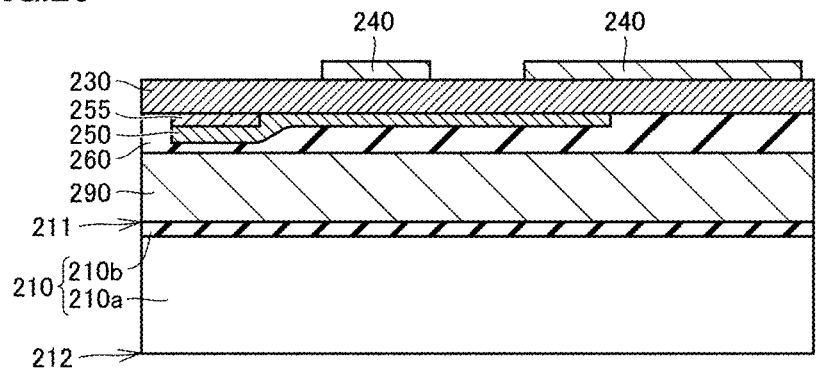
FIG. 23 is a cross-sectional view showing a state in which an upper electrode layer is provided on the upper surface of the single crystal piezoelectric layer in an example of a manufacturing method for the piezoelectric device according to the second preferred embodiment of the present invention.

FIG. 23 is a cross-sectional view showing a state in which the upper electrode layer is provided on the upper surface of the single crystal piezoelectric layer in the example of the manufacturing method for the piezoelectric device according to the second preferred embodiment of the present invention. As shown in FIG. 23, the upper electrode layer 240 is provided on a portion of the upper surface of the single crystal piezoelectric layer 230 by the lift-off method, the plating method, the etching method, or the like, for example.

Figure 24:
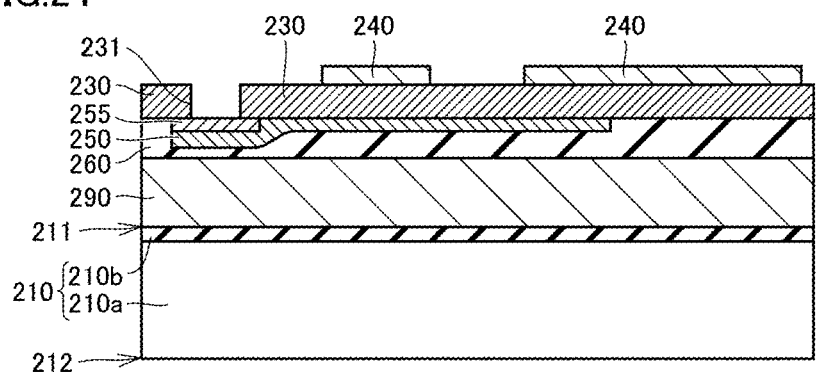
FIG. 24 is a cross-sectional view showing a state in which a hole portion is provided in the single crystal piezoelectric layer in an example of a manufacturing method for the piezoelectric device according to the second preferred embodiment of the present invention.

FIG. 24 is a cross-sectional view showing a state in which the hole portion is provided in the single crystal piezoelectric layer in the example of the manufacturing method for the piezoelectric device according to the second preferred embodiment of the present invention. As shown in FIG. 24, by etching a portion of the single crystal piezoelectric layer 230, the hole portion 231 is formed.

Figure 25:
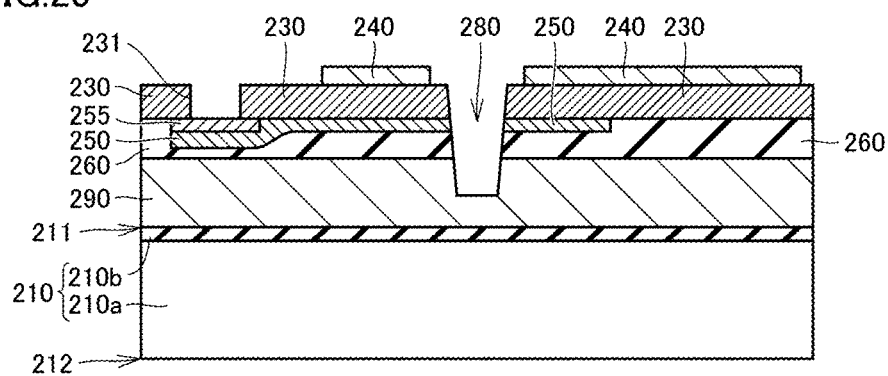
FIG. 25 is a cross-sectional view showing a state in which a through-groove is provided from the single crystal piezoelectric layer to the middle of an active layer in an example of a manufacturing method for the piezoelectric device according to the second preferred embodiment of the present invention.

FIG. 25 is a cross-sectional view showing a state in which the through-groove is provided from the single crystal piezoelectric layer to the middle of the active layer in the example of the manufacturing method for the piezoelectric device according to the second preferred embodiment of the present invention. As shown in FIG. 25, by etching from the single crystal piezoelectric layer 230 side, the through-groove 280 is formed from the single crystal piezoelectric layer 230 to the middle of the active layer 290. With this, a trench is formed in the active layer 290.

Figure 26:
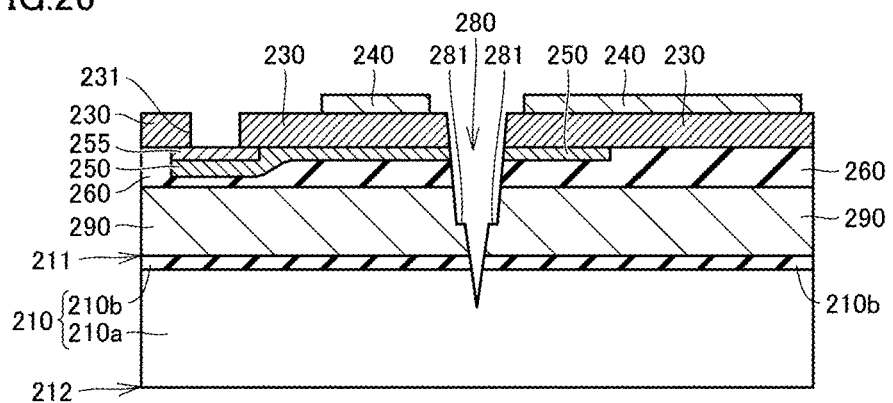
FIG. 26 is a cross-sectional view showing a state in which the through-groove reaches the lower surface of the active layer in an example of a manufacturing method for the piezoelectric device according to the second preferred embodiment of the present invention.

FIG. 26 is a cross-sectional view showing a state in which the through-groove reaches the lower surface of the active layer in the example of the manufacturing method for the piezoelectric device according to the second preferred embodiment of the present invention. As shown in FIG. 26, by further etching the bottom portion of the trench formed in the active layer 290, the through-groove 280 reaches the lower surface of the active layer 290. With this etching, in the base portion 210, a trench as shown in FIG. 26 may be formed, or a trench may not be formed.

Figure 27:
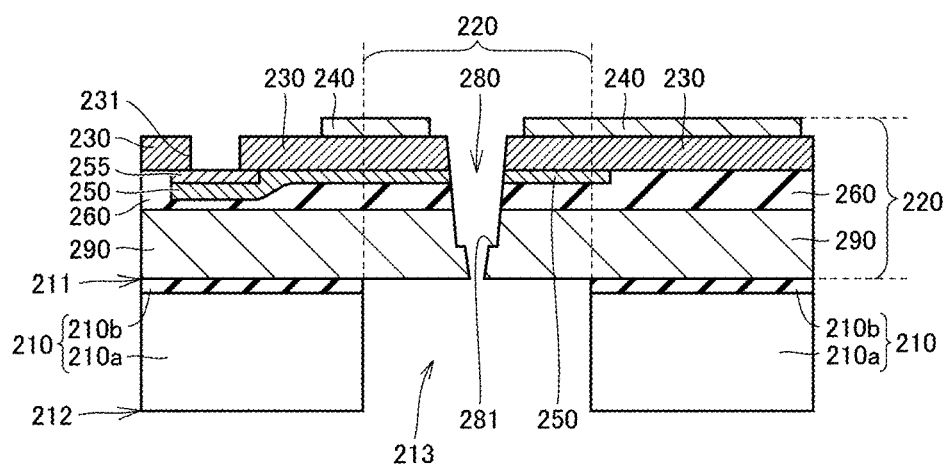
FIG. 27 is a cross-sectional view showing a state in which an opening portion is formed in an example of a manufacturing method for the piezoelectric device according to the second preferred embodiment of the present invention.

FIG. 27 is a cross-sectional view showing a state in which the opening portion is formed in the example of the manufacturing method for the piezoelectric device according to the second preferred embodiment of the present invention. As shown in FIG. 27, the opening portion 213 is formed in the base portion 210 by performing deep reactive ion etching or the like, for example, on the base portion 210 from the lower side main surface 212 side of the base portion 210. As a result, in the piezoelectric device 200 according to the second preferred embodiment, the membrane portion 220 is formed.

Finally, the first outer electrode layer 171 and the second outer electrode layer 172 are each provided by the lift-off method, the plating method, the etching method, or the like, for example. Through the above-described steps, the piezoelectric device 200 according to the second preferred embodiment of the present invention as shown in FIG. 17 is manufactured.

As described above, in the piezoelectric device 200 according to the second preferred embodiment of the present invention, the through-groove 280 includes the first step portion 281 provided in the thickest layer among the plurality of layers defining the membrane portion 220, and the width of the through-groove 280 is narrower on the lower side than on the upper side with the first step portion 281 as a boundary.

As a result, stress concentration on a portion between the active layer 290, which is the thickest layer, and the intermediate layer 260 adjacent to or in a vicinity of the active layer 290, on which the highest stress acts when the membrane portion 220 performs bending vibration, is able to be significantly reduced or prevented by the first step portion 281, and thus an occurrence of delamination between the active layer 290 and the intermediate layer 260 due to the stress generated in the membrane portion 220 is able to be significantly reduced or prevented.

In particular, in the second preferred embodiment, since the end surface of the intermediate layer 260 and the end surface of the active layer 290 each of which is located on the through-groove 280 side are mutually continuous in the up-down direction, the stress concentration between the active layer 290 and the intermediate layer 260 is able to be significantly reduced or prevented by the first step portion 281.

In the piezoelectric device 200 according to the second preferred embodiment, the width of the through-groove 280 decreases as progressing from the upper end toward the lower end of the through-groove 280. With this, the width of the through-groove 280 on the lower side relative to the first step portion 281 is able to be significantly reduced while ensuring the wide width of the through-groove 280 in the portion where the single crystal piezoelectric layer 230 is located.

Accordingly, the stress acting on the single crystal piezoelectric layer 230 when the membrane portion 220 performs bending vibration is able to be significantly reduced or prevented, and the occurrence of delamination at each of the portion between the single crystal piezoelectric layer 230 and the upper electrode layer 240 and the portion between the single crystal piezoelectric layer 230 and the lower electrode layer 250 is able to be significantly reduced or prevented. Furthermore, since the width of the through-groove 280 on the lower side relative to the first step portion 281 is able to be significantly reduced, an occurrence of deterioration in characteristics of the piezoelectric device 200 due to an excessive increase in the width of the through-groove 280 is able to be significantly reduced or prevented. For example, in a case where the piezoelectric device 200 is implemented as an acoustic device, a decrease in acoustic resistance due to the excessive increase in the width of the through-groove 280 is able to be significantly reduced or prevented.

In the piezoelectric device 200 according to the second preferred embodiment, the single crystal piezoelectric layer 230 is preferably made of lithium tantalate or lithium niobate. Accordingly, the piezoelectricity of the piezoelectric device 200 is able to be significantly improved.

Note that in the piezoelectric device 200 according to the second preferred embodiment, a plurality of step portions may be provided in the through-groove 280. Here, modifications of the piezoelectric device 200 according to the second preferred embodiment will be described.

Figure 28:
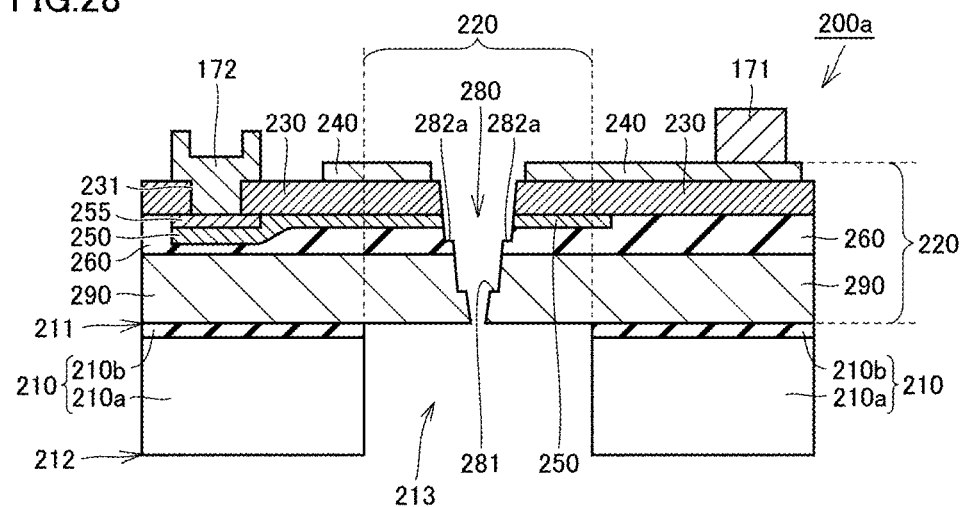
FIG. 28 is a cross-sectional view of a piezoelectric device according to a first modification of the second preferred embodiment of the present invention.

FIG. 28 is a cross-sectional view of a piezoelectric device according to a first modification of the second preferred embodiment of the present invention. The cross-sectional view of a piezoelectric device 200a shown in FIG. 28 shows a cross section viewed similar to the cross-sectional view of the piezoelectric device 200 shown in FIG. 17.

As shown in FIG. 28, in the piezoelectric device 200a according to the first modification of the second preferred embodiment of the present invention, the through-groove 280 further includes a second step portion 282a provided in the intermediate layer 260.

In the present modification, the second step portion 282a may be formed by, for example, performing etching to provide the through-groove 280 in the intermediate layer 260 in two divided steps. First, a first trench is formed in the intermediate layer 260 by first etching. A second trench is formed by etching the bottom portion of the first trench by second etching. With this, the second step portion 282a is able to be formed in the intermediate layer 260.

Figure 29:
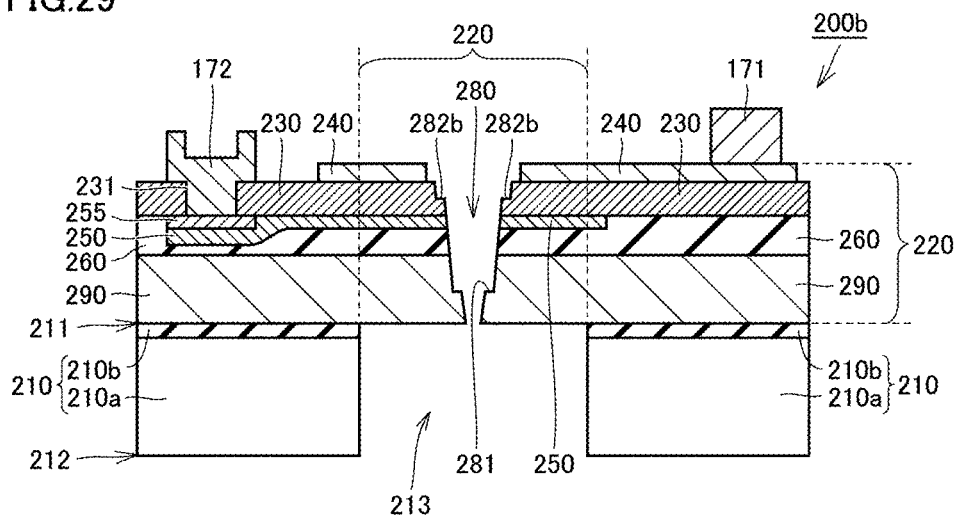
FIG. 29 is a cross-sectional view of a piezoelectric device according to a second modification of the second preferred embodiment of the present invention.

FIG. 29 is a cross-sectional view of a piezoelectric device according to a second modification of the second preferred embodiment of the present invention. The cross-sectional view of a piezoelectric device 200b shown in FIG. 29 shows a cross section viewed similar to the cross-sectional view of the piezoelectric device 200 shown in FIG. 17.

As shown in FIG. 29, in the piezoelectric device 200b according to the second modification of the second preferred embodiment of the present invention, the through-groove 280 further includes a second step portion 282b provided in the single crystal piezoelectric layer 230.

In the present modification, the second step portion 282b may be formed by, for example, performing etching to provide the through-groove 280 in the single crystal piezoelectric layer 230 in two divided steps. First, a trench is formed in the single crystal piezoelectric layer 230 by first etching. The bottom portion of the trench of the single crystal piezoelectric layer 230 is etched by second etching. As a result, the second step portion 282b is able to be formed in the single crystal piezoelectric layer 230.

Figure 30:
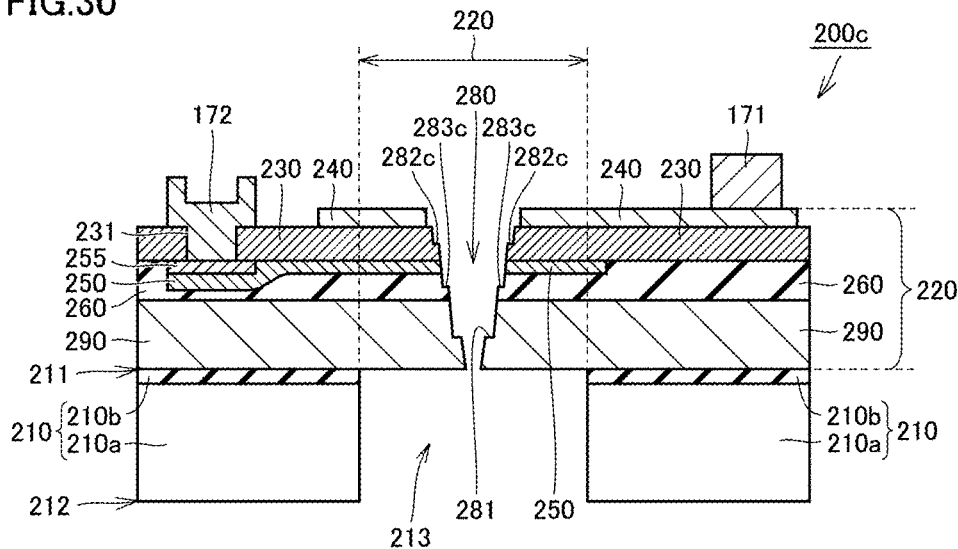
FIG. 30 is a cross-sectional view of a piezoelectric device according to a third modification of the second preferred embodiment of the present invention.

FIG. 30 is a cross-sectional view of a piezoelectric device according to a third modification of the second preferred embodiment of the present invention. The cross-sectional view of a piezoelectric device 200c shown in FIG. 30 shows a cross section viewed similar to the cross-sectional view of the piezoelectric device 200 shown in FIG. 17.

As shown in FIG. 30, in the piezoelectric device 200c according to the third modification of the second preferred embodiment of the present invention, the through-groove 280 further includes a second step portion 282c provided in the intermediate layer 260, and a third step portion 283c provided in the single crystal piezoelectric layer 230.

In the present modification, the second step portion 282b and the third step portion 283c may be formed by, for example, performing etching to provide the through-groove 280 in the single crystal piezoelectric layer 230, the lower electrode layer 250, and the intermediate layer 260 in three divided steps. First, a trench is formed in the single crystal piezoelectric layer 230 by first etching. The bottom portion of the trench of the single crystal piezoelectric layer 230 is etched by second etching, and a trench is formed in the intermediate layer 260. With this, the third step portion 283c is able to be formed in the single crystal piezoelectric layer 230. The bottom portion of the trench of the intermediate layer 260 is etched by third etching. As a result, the second step portion 282c is able to be formed in the intermediate layer 260.

As described above, in the piezoelectric devices 200a, 200b, and 200c respectively according to the first modification, the second modification, and the third modification of the second preferred embodiment of the present invention, the through-groove 280 further includes the second step portion 282a, 282b, or 282c, or the third step portion 283c provided in any one layer among the plurality of layers defining the membrane portion 220, above the first step portion 281. The width of the through-groove 280 is narrower on the lower side than on the upper side with each of the second step portions 282a, 282b, and 282c, and the third step portion 283c as a boundary.

As a result, stress concentration between layers of the plurality of layers defining the membrane portion 220 when the membrane portion 220 performs bending vibration is able to be significantly reduced or prevented also by the second step portions 182a, 182b, and 282c, and the third step portion 283c, and thus an occurrence of delamination due to the stress generated in the membrane portion 220 is able to be further significantly reduced or prevented.

In the description of the preferred embodiments described above, combinable features, components, and elements may be combined with each other.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric device comprising:
    a base portion; and
    a membrane portion that is indirectly supported by the base portion, is located on an upper side relative to the base portion, and includes a plurality of layers; wherein
    the membrane portion does not overlap with the base portion and includes a single crystal piezoelectric layer, an upper electrode layer provided on an upper side of the single crystal piezoelectric layer, and a lower electrode layer that faces at least a portion of the upper electrode layer with the single crystal piezoelectric layer interposed between the upper electrode layer and the lower electrode layer;
    the membrane portion is provided with a through-groove penetrating in an up-down direction;
    the through-groove includes a first step portion provided in a thickest layer among the plurality of layers defining the membrane portion; and
    a width of the through-groove is narrower on a lower side than on an upper side with the first step portion defining a boundary.

2. The piezoelectric device according to claim 1, wherein
    the through-groove further includes a second step portion provided in any one layer of the plurality of layers defining the membrane portion above the first step portion; and
    the width of the through-groove is narrower on a lower side than on an upper side with the second step portion defining a boundary.

3. The piezoelectric device according to claim 1, wherein the width of the through-groove decreases as progressing from an upper end toward a lower end of the through-groove.

4. The piezoelectric device according to claim 1, wherein the single crystal piezoelectric layer is made of lithium tantalate or lithium niobate.

5. The piezoelectric device according to claim 1, wherein a portion of the single crystal piezoelectric layer extends from the membrane portion.

6. The piezoelectric device according to claim 5, wherein the portion of the single crystal piezoelectric layer includes a hole portion that penetrates through the single crystal piezoelectric layer in the up-down direction.

7. The piezoelectric device according to claim 6, wherein the hole portion is located above the base portion in the up-down direction.

8. The piezoelectric device according to claim 1, wherein a close contact layer is provided between the upper electrode layer and the single crystal piezoelectric layer.

9. The piezoelectric device according to claim 5, wherein
    a portion of the lower electrode layer extends from the membrane portion; and
    a close contact layer is provided between the portion of the lower electrode layer that extends from the membrane portion and the portion of the single crystal piezoelectric layer that extends from the membrane portion.

10. The piezoelectric device according to claim 1, further comprising an intermediate layer that is in contact with a lower surface of the lower electrode layer.

11. The piezoelectric device according to claim 10, wherein the intermediate layer is in contact with a portion of the single crystal piezoelectric layer.

12. The piezoelectric device according to claim 10, wherein the intermediate layer includes a recessed portion.

13. The piezoelectric device according to claim 1, further comprising:
    a first outer electrode layer electrically connected to the upper electrode layer; and
    a second outer electrode layer electrically connected to the lower electrode layer.

14. The piezoelectric device according to claim 1, wherein the single crystal piezoelectric layer performs bending vibration in response to a voltage applied between the upper electrode layer and the lower electrode layer.

* * * * *